United States Patent
Panfil et al.

(10) Patent No.: US 9,478,953 B2
(45) Date of Patent: Oct. 25, 2016

(54) CORROSION RESISTANT EMI SHIELDING ASSEMBLY FOR A STUFFING TUBE AND A METHOD FOR MAKING A GASKET FOR USE THEREWITH

(71) Applicant: Aviation Devices & Electronic Components, L.L.C., Fort Worth, TX (US)

(72) Inventors: Matthew Panfil, Fort Worth, TX (US); Matthew Boyd, Fort Worth, TX (US); Michael Dry, Fort Worth, TX (US); Kent Boomer, Aledo, TX (US); Jeff Busby, Millsap, TX (US)

(73) Assignee: The Patent Well LLC, Fort Worth, TX (US)

(*) Notice: Subject to any disclaimer, the term of this patent is extended or adjusted under 35 U.S.C. 154(b) by 166 days.

(21) Appl. No.: 14/151,139

(22) Filed: Jan. 9, 2014

(65) Prior Publication Data
US 2014/0190720 A1 Jul. 10, 2014

Related U.S. Application Data (60) Provisional application No. 61/750,558, filed on Jan. 9, 2013.

(51) Int. Cl.
*H02G 3/04* (2006.01)
*H01B 9/02* (2006.01)
(Continued)

(52) U.S. Cl.
CPC .......... *H02G 3/0462* (2013.01); *H01B 17/308* (2013.01); *F16J 15/06* (2013.01);
(Continued)

(58) Field of Classification Search
CPC ........ H02G 3/24; H02G 3/0462; H02G 3/22; H01R 4/646; H01R 13/348; H01R 13/658; H01R 13/6598; H01R 13/6485; H01R 13/65802; H01R 13/6582; H01R 13/6584; H01R 13/648; H05K 9/0018; H05K 9/0081; H05K 9/0015; H05K 9/009; H05K 9/0098; H05K 9/0086; H01B 9/021; H01B 17/308; F16J 15/00; F16J 15/21; F16J 15/064; F16J 15/187; F16J 15/18; F16J 15/184; F16J 15/185; F16J 15/20

USPC .... 174/68.3, 68.1, 70 R, 74 R, 75 R, 78, 79, 174/70 C, 98, 102 R, 104, 105 R, 102 C, 650, 174/350, 362, 358, 351, 366, 370, 357, 174/77 R, 94 R, 388, 390, 393, 394; 428/357; 277/650, 628, 654, 651, 920, 277/627, 606

See application file for complete search history.

(56) References Cited

U.S. PATENT DOCUMENTS 4,379,204 A * 4/1983 Perrault ................... H02G 3/22
174/653

(Continued)

FOREIGN PATENT DOCUMENTS

EP  0114813  7/1982

OTHER PUBLICATIONS

MIL-S-24235/18A(SH), Superseding MIL-S-24235/18(SH), Aug. 21, 1989, Military Specification Sheet; Stuffing Tubes, Metal, and Packing Assemblies . . . , 10 pages Dec. 28, 1992.

(Continued)

*Primary Examiner* — Dimary Lopez Cruz
(74) *Attorney, Agent, or Firm* — Jackson Walker, LLP (57) ABSTRACT

An elongated, flexible composite gasket member having a knitted wire mesh rope at least partly impregnated with a soft, tacky, flowable, pre-cured polyurethane gel for use in a stuffing tube assembly. The stuffing tube assembly is used in a deck or bulkhead of a ship. The stuffing tube comprises a cable having insulation on a surface thereof, a metallic shielding jacket, and conductors therein, the cable having an exposed section of metallic shielding and non-exposed section; a metallic stuffing tube with an inner cable channel and an at least partly threaded gland nut receiver space, and a constriction between the gland nut receiver space and the inner channel; a gland nut adapted to threadably engage the gland nut receiver space; and a; wherein the cable passes through the gland nut and stuffing tube with the exposed section substantially wrapped in the elongated flexible composite gasket member the gland nut above the elongated flexible composite material and the constriction below. The flexible gasket member is in electrical communication with the cable and the stuffing tube.

34 Claims, 6 Drawing Sheets

(51) Int. Cl.
*H02G 3/22* (2006.01)
*H01B 17/30* (2006.01)
*H01R 13/658* (2011.01)
*H01R 13/6584* (2011.01)
*H05K 9/00* (2006.01)
*F16J 15/06* (2006.01)
*F16J 15/18* (2006.01)

(52) U.S. Cl.
CPC ........... *F16J 15/18* (2013.01); *H01R 13/6584* (2013.01); *H01R 13/65802* (2013.01); *H02G 3/22* (2013.01); *H05K 9/0018* (2013.01); *H05K 9/0086* (2013.01)

(56) References Cited

U.S. PATENT DOCUMENTS

| | | | | |
|---|---|---|---|---|
| 4,547,623 A * | 10/1985 | Van Brunt | ............. | H01R 4/646 174/359 |
| 4,781,619 A * | 11/1988 | Ikeda | ................... | H01R 13/465 29/748 |
| 4,852,646 A * | 8/1989 | Dittmer | ................ | C08K 3/0033 165/185 |
| 4,900,877 A * | 2/1990 | Dubrow | ............... | H05K 9/0015 174/351 |
| 4,904,826 A * | 2/1990 | Dixon | .................. | H05K 9/0018 174/362 |
| 5,237,129 A * | 8/1993 | Obara | ...................... | H02G 3/22 174/650 |
| 5,512,709 A | 4/1996 | Jencks et al. | | |
| 6,530,577 B1 | 3/2003 | Busby | | |
| 6,695,320 B2 | 2/2004 | Busby | | |
| 7,229,516 B2 | 6/2007 | Busby | | |
| 8,148,639 B2 * | 4/2012 | Auphand | ................. | H01B 7/36 174/110 R |
| 8,613,881 B2 * | 12/2013 | Soong | .................... | C08J 9/0066 264/41 |
| 8,759,692 B2 * | 6/2014 | Bunyan | ................. | H02G 13/00 174/2 |
| 8,766,108 B2 * | 7/2014 | Bunyan | ................. | H02G 13/00 174/355 |
| 2007/0203623 A1 * | 8/2007 | Saunders | ............. | G05D 1/0206 701/23 |
| 2009/0226696 A1 * | 9/2009 | Simpson | ................ | C08J 9/0066 428/304.4 |

OTHER PUBLICATIONS

MIL-S-24235C(SH), Supersecing MIL-S-24235B(SH), Aug. 21, 1989, Military Specification; Stuffing Tubes, Metal, and Packing Assemblies . . . , 15 pages Dec. 28, 1992.

* cited by examiner

CORROSION RESISTANT EMI SHIELDING ASSEMBLY FOR A STUFFING TUBE AND A METHOD FOR MAKING A GASKET FOR USE THEREWITH

This application is based upon and claims priority from U.S. provisional application Ser. No. 61/750,558, filed Jan. 9, 2013, which is incorporated herein by reference.

BACKGROUND OF THE INVENTION

1. Field of the Invention

Electromagnetic interference ("EMI") shielding gasket assembly for stuffing tubes in ships.

2. Background Information

Modern ships, watercraft, buildings, and vehicles often include electronic equipment that is used within the interior, but often has antenna or other functional parts extending outside. For this reason, there must be an electrical communication from the outside that extends through the wall into the interior. The need for watertight seals often require that special allowances be made. Thus, in conventional construction, ships, buildings, vehicles, and the like use stuffing tubes where electrical communication lines (such as electrical cables) extend through the wall, deck or a bulkhead.

In general, a stuffing tube comprises a tubular or cylindrical shell inserted through a deck or bulkhead and attached there via a weld, adhesive, or fastener. The cable extends from the exterior structure (such as mast or antenna) through the stuffing tube and to the electronic equipment. Seals are used around the cable in the interior of the tube, as well as various machined parts that compress the seal. The seals resist water and air flow between the interior and exterior of the ship.

Shipboard waterproof transition fittings, kick pipes or stuffing boxes are provided to route cables between topside and below deck or between bulkheads defining inter-compartmental spaces. Typically a metallic boundary is provided to shunt environmental EMI or electromagnetic pulse ("EMP") signals to a metallic boundary, such as the ship deck. EMI (also sometimes called radio-frequency interference or "RFI") is a disturbance that affects an electrical circuit due to either electromagnetic induction or electromagnetic radiation emitted from an external source. The disturbance may interrupt, obstruct, or otherwise degrade or limit the effective performance of the circuit. The source may be any object, artificial or natural, that carries rapidly changing electrical currents, such as the cable extending through the stuffing tube. The ship deck may be envisioned as a system ground plane, for grounding above deck conduit or cable. Without proper grounding to the ground plane, any external substantial EMI source or EMP pulse may penetrate the metallic boundary (deck), enter below decks, and harm susceptible, sensitive electronic equipment.

Figures 1, 2:
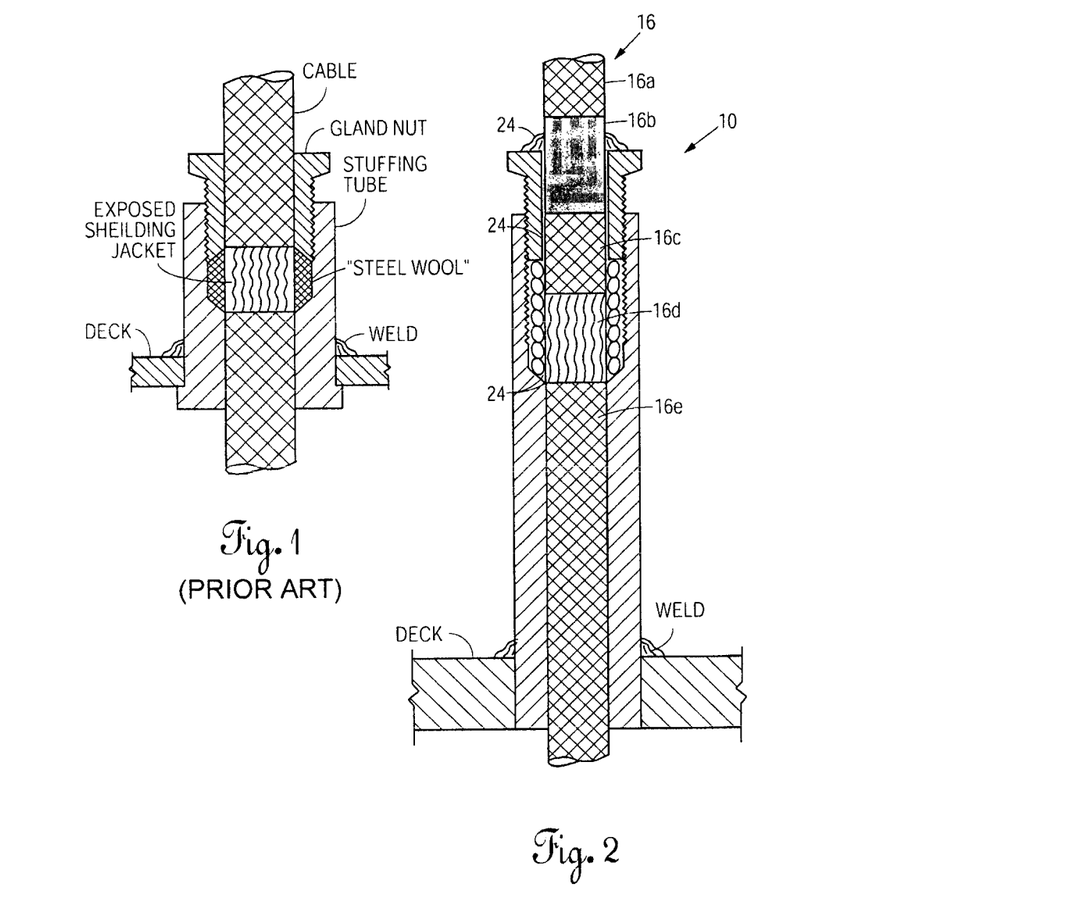
FIG. 1 illustrates the prior art stuffing tube assembly in cross-section.
FIG. 2 illustrates a side elevational view of Applicant's EMI shielding assembly, including the stuffing tube engaging a ship's deck (or a ship's bulkhead).

In FIG. 1, illustrating prior art, a metallic fitting, such as a stuffing tube, is seen to engage and direct a cable to the deck or bulkhead. Moreover, it is seen that conduit insulation is stripped from the fitting to expose at least some of the metallic shield jacket, such that it is inside the fitting. Finally, it may be seen, in the prior art, that a metallic substance, such as a steel wool type compressible material having a multiplicity of filaments, may be jammed in to a stuffing tube space beneath the gland nut and the gland nut tightened down. Tightening the gland nut will squeeze some of the air out, and jam the filaments of the steel wool down, so there are multiple electrical paths between the exposed shielding jacket and the metallic stuffing tube. Thus, a strong EMI/EMP generated signal or current on the shield gasket is grounded to the ship deck.

SUMMARY OF THE INVENTION

A stuffing tube assembly for use with a wall, deck or bulkhead (collectively "metallic shell") of a ship, building or other vehicle, the stuffing tube comprising a cable having insulation on a surface thereof, a metallic shielding jacket, and conductors therein, the cable having an exposed section of metallic shielding and non-exposed section; a metallic stuffing tube with an inner cable channel and an at least partly threaded gland nut receiver space, and a constriction between the gland nut receiver spare and the inner channel; a gland nut adapted to threadably engage the gland nut receiver space; and an elongated, flexible composite gasket member comprising a conductive member, such as a knitted wire mesh rope, at least partly impregnated with a soft, tacky, flowable, pre-cured polyurethane gel; wherein the cable passes through the gland nut and stuffing tube with the exposed section substantially wrapped in the elongated flexible composite gasket member the gland nut above the elongated flexible composite material and the constriction below. The flexible gasket member is in electrical communication with the cable and the stuffing tube.

DETAILED DESCRIPTION OF THE PREFERRED EMBODIMENT

Figure 3A:
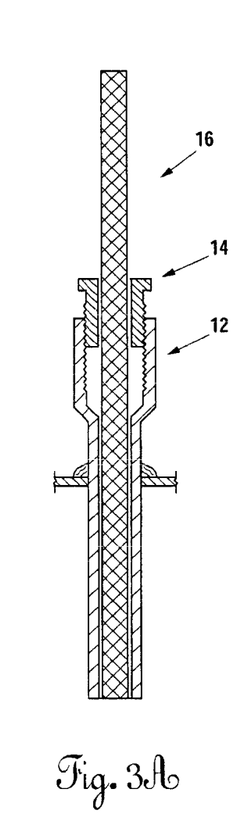
FIGS. 3A-3I illustrate the steps of providing an environmental seal with favorable EMI shielding to a stuffing tube carrying a cable therethough, the views being elevational views of the stuffing tube through the deck carrying the cable, gland nut, and gasket of Applicant's present invention.
Figure 3B:
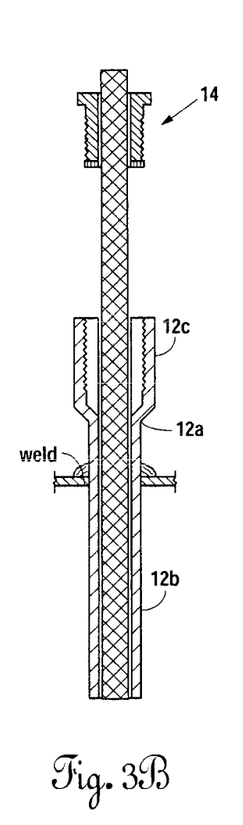
Figure 3C:
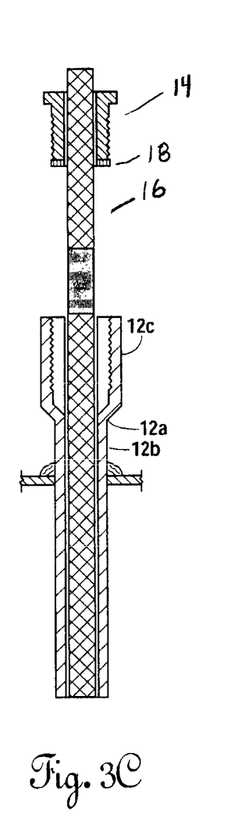
Figure 3D:
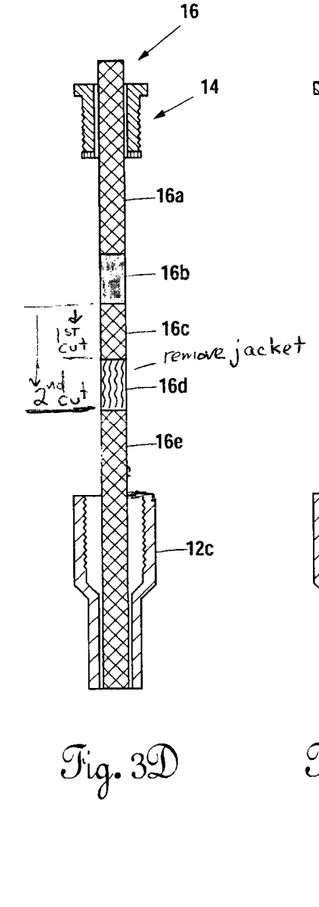
Figure 3E:
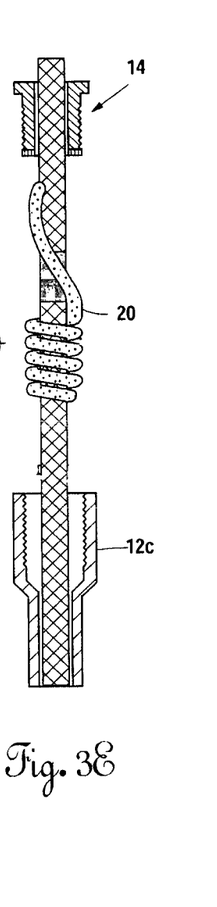
Figure 3F:
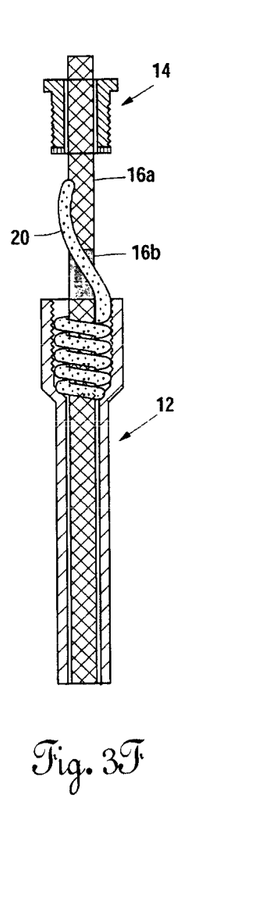
Figure 3G:
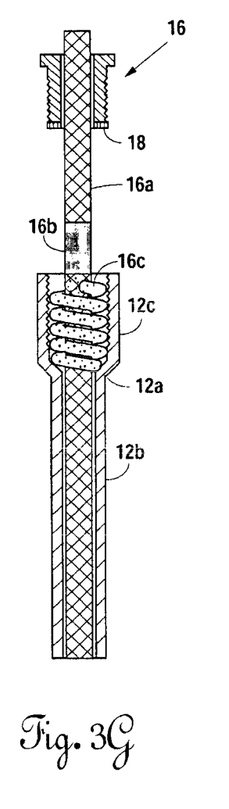
Figure 3H:
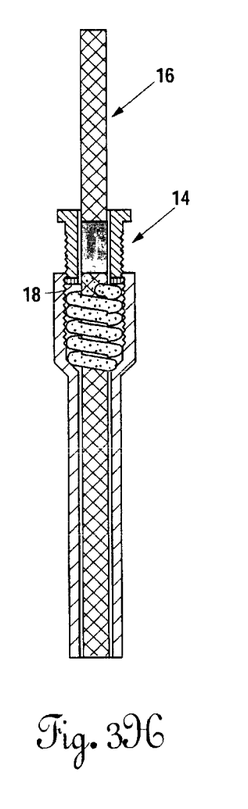
Figure 3J:
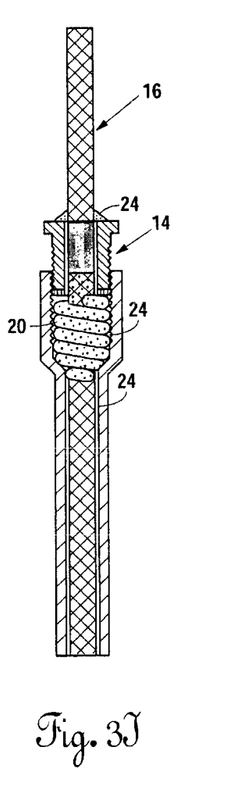

Turn to FIGS. 2, 3H, and 3I for some of the structure and function of Applicant's EMI shielding gasket assembly 10. Applicant's EMI shielding gasket assembly 10 is seen to comprise a cable 12 running through a deck D by means of a fitting sometimes called a stuffing tube 12. Stuffing tube 12 is configured to allow a cable, including a cable bearing insulation and an EMI shield layer near the outer surface thereof, to pass through from a point above deck to a point below deck. Deck here refers to a tabular metallic member and includes what is traditionally understood to be a generally horizontal deck on a ship, but it also here used to include a generally vertical bulkhead member as often found on ships.

It is known that the interiors of ships often carry sensitive electronic equipment. This equipment often engages cables outside of the metallic shell defining the interior of the ship or a compartment thereof. One such cable is an antenna cable. The cables may be protected with a metallic conduit or they may simply run through a stuffing box and be grounded as in FIG. 1. If they run through a stuffing box, then an EMI shielding layer of the cable needs to be grounded to the stuffing box as the cable may carry EMI or an electromagnetic pulse or other interference. The sensitive electronic equipment found on the interior of the ship needs to be protected, thus some form of grounding between the cable and stuffing box is typically provided as, for example, see the prior art in FIG. 1.

Turning to Applicant's EMI shielding stuffing box gasket assembly 10, it is seen that the stuffing tube 12 may sometimes be configured with a pinched section 12a, below which is a cable section 12b having a diameter just sufficient to carry the cable therethrough. Above the pinched section is typically a cable/nut section 12c configured to receive not only the cable, but a larger diameter gland nut 14 to be received on the threads of the at least partially threaded cable/nut section 12c.

Deck "D" is typically metallic, typically tabular and steel, the stuffing tube being steel and the welds securing the stuffing box thereto. Grounding the cable, as shown in the prior art to the stuffing box elements thereof, grounds the shielding jacket and any substantial EMI signal or EMP signal carried thereon to the ship's deck, which acts as a grounding plane. In this manner, the electronic equipment in the interior of the ship is protected.

Cable 16, as it runs through stuffing tube 12, from above the stuffing tube to below decks may be seen in FIG. 2 to have several sections. First, there is a section 16a of uncut or unaltered cable 16 for placement above and below fitting. A warning tape 16b of contrasting color is applied (adjacent top edge of 12c as seen in FIG. 2) and below that is an uncut section 16c sealed within stuffing tube. Section 16d has a cut, the cut exposing the shielding jacket of the cable by removing the insulation therefrom. Below the cut, section 16e (unaltered cable) is provided, which carries insulation thereon and extends through cable section 12b and below decks. A base stuffing tube washer 18 may be provided.

An elongated, flexible gel/conductor composite gasket member 20 is provided having an electrical conductor portion 22, typically being metallic or at least partially metallic, and a gel portion 24, typically being a soft, tacky, springy, pre-cured flowable (when under compression) polyurethane gel for a good environmental seal. It is seen that cable 16 passes through gland nut 14 and stuffing tube 12 with the exposed section 16d substantially wrapped in the composite gasket 20 with the gland nut above and the constricted or pinched section 12a below. The position of the exposed section along the length of the cable is determined by placing a marker or tape 16b, such as a piece of tape or applied pigment, on the cable indicating the correct position and making cuts in the insulation surrounding the cable to expose conductive elements, such as metallic wire, in the cable.

The gland nut is torqued down and the soft, flowable (when under compression) gel portion 24 will be squeezed responsive thereto. This squeezes out much of the air and allows the gel flow somewhat to contact any annular portions between the inside of the gland nut and the exterior of the conductor, and portions of the filled space above the restrictor and below the gland nut with the flowable gel. The gland nut urges the gel flow, thereby helping to provide an effective environmental seal. At the same time, compression generated by gland nut torque allows the malleable wire filaments and strands of the conductive portion of the composite gasket 20 to be crushed and urged against both the jacket shielding and the metallic interior portion of the cable/nut section 12c (also referred to sometimes as stuffing tube bell).

Applicants wrap the composite gasket 20 tightly around at least the exposed portion 16d of the cable. Applicants feed the wrapped cable into the open end of the stuffing tube and firmly pack the gasket material 20 into the tube and then torque the gland nut down. If there is a stuffing tube washer 18, it may be first inserted and slid down to the point up against the constriction. When the gland nut is torqued down, the gel flows, sealing voids in the tube nut and other portions of the assembly. Some gel may flow or squeeze out the top and bottom of the stuffing tube and make an excellent environmental seal. The cable will be grounded up to 360° around the exposed jacket shielding through the use of the compressed metallic mesh, as such providing excellent EMI/EMP protection. The gel allows the conductive mesh 22 to make electrical contact, but still encapsulates most of the wires of the mesh, not allowing voids for moisture which may cause galvanic corrosion.

Turning now to FIG. 3A-3I, Applicants' environmental sealant and conductive gasket installation is described. In FIG. 3A, any preexisting sealing material is removed and the gland nut is removed to expose and separate the gland nut and stuffing tube. In FIG. 3B, the removal of the gland nut and gland ring away from the stuffing tube is illustrated. It may be necessary to hold the nut and ring with tape or other means against the cable, up and away from the stuffing tube junction with the deck.

FIG. 3C illustrates the placement of a piece of tape of contrasting color (to the insulation) around the cable immediately adjacent the top of the stuffing tube, to illustrate the placement of the gland nut and stuffing tube during torque down. At this point, any packing material or preexisting sealants may be removed from the previous insulation and the cable and exposed jacket cleaned and dried. If a bevel reducing adapter (not shown) is used, it should be clean and slid away from the stuffing tube and placed near the gland nut and any gland ring upstream or above the insulation.

FIG. 3D illustrates the cutting of the cable insulation. The Chart below shows the various tube sizes: A-F, G-J, K-R, and S-Z, along with the position of the first and second cuts, so as to locate exposed section 16d at the proper location adjacent the inner walls of the stuffing tube. Following the cutting, if a bevel reducing adapter is used, it should be installed into the stuffing tube and will be positioned generally downstream of exposed section 16d.

| Tube Size | $1^{st}$ Cut | $2^{nd}$ Cut |
|---|---|---|
| A thru F | 1⅝" | ¹¹/₁₆" |
| G thru J | 1¹¹/₁₆" | ¾" |
| K thru R | 3" | 1⅛" |
| S thru Z | 5" | 1¾" |

FIG. 3E illustrates the manner of wrapping the conductive environmental and EMI sealing material composite gasket member 20 around the exposed shield typically in a clockwise wrap when looking into the stuffing tube, such that torquing down the gland nut tightens the coil of sealing material and squeezes out moisture and air.

FIG. 3F illustrates the step of pushing the wrapped cable with conductive sealant gasket material back into the stuffing tube and cutting off any excess material. Following the step illustrated in FIG. 3F, any additional material may be added to fill the stuffing tube bell, taking care not to damage the cable or expose shield material, after which the conductive/sealant gasket material 20 is trimmed to the proper length with scissors or similar tool. Tape section 16b may be used to locate the cable in the tube, such that the cut section 16d is positioned properly in the bell typically above the pinched section 12a.

FIG. 3H illustrates the installation of the gland ring (if present) and gland nut and FIG. 3I illustrates the torquing down of the gland nut to the appropriate torque value.

Correct installation typically will satisfy the following conditions: two to three threads of gland nut are exposed; the cable does not slip when a modest tug is exerted; and the gland nut cannot be turned by hand.

If any of the conditions listed in the preceding step are not met, the installer may remove the gland nut and gland ring and repeat the instructions beginning with FIG. 3H, and install additional conductive environment gel sealing material 24.

Figures 4A, 4B:
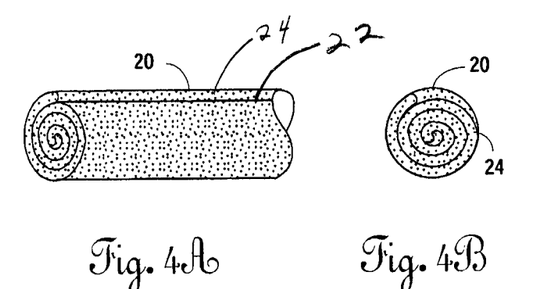
FIGS. 4A and 4B illustrate perspective and end views of a rope-like composite gasket for use with Applicant's stuffing tube assembly.
Figure 4C:
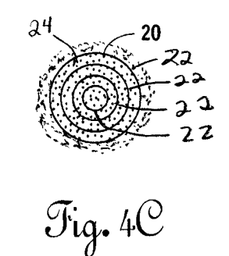
FIGS. 4C and 4D illustrate cross-sectional views, lateral and longitudinal, of a rope-like composite gasket for use with the stuffing tube assembly.
Figure 4D:
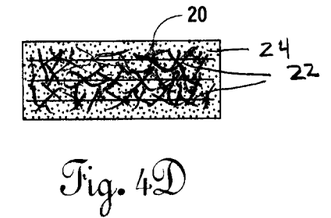
Figure 5:
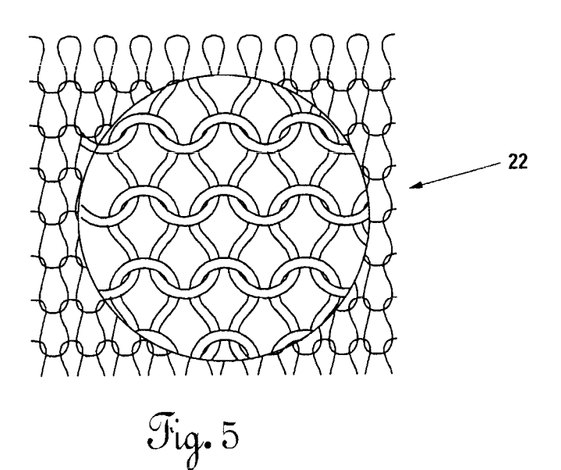
FIG. 5 illustrates a knitted wire mesh in top plan view that may be used as a metallic or conductive component of Applicant's composite gasket elongated member.

Gel/conductive composite gasket 20 may include a wire conductor portion 22, in one embodiment, a metallic, knitted rope as seen in FIG. 5, and available from Loose Wire Rope, Powfert, Conn. FIG. 5 shows the nature of the interlocking loops of the knitted wire mesh. Such rope may be 1/4", 5/16", to 3 inches in diameter or other suitable size, and may have a general circular cross-section made up of multiple plies (see FIGS. 4A, 4B, 4C) or may be rectangular in cross-section instead of circular (see FIG. 4D). FIG. 4 also shows a multi-filament, metal wire component 22, rather than a knitted wire. In one embodiment, the wire making up the rope may be about 3 to about 25 mil in diameter and may be aluminum, bronze, nomel, silver, plated metal, or the like. The term "mesh" is intended to include knitted, but also any multi-strand ordered (woven, knitted, etc.) or disordered (like steel wool, for example) arrangement of metal strands.

The gel may be the two part polyurethane gel described in Avdec U.S. Pat. Nos. 6,530,577; 6,695,320; and 7,229,516, which patents are incorporated herein by reference. The gel may be a two-part polyurethane gel, which is mixed and, before curing, impregnated into the conductor material 22, then allowed to cure.

Applicants provide a conductive/gel gasket 20, which is preformed and may have the following beneficial properties: elasticity, low water absorption, low water content, silicon leak-free, desiccation resistant, and surface tackiness.

The elasticity and pliability, along with the flowability (under compression), makes an effective seal between two surfaces and helps seal over surface irregularities and irregularities that may be due to structural flexing or vibration.

Applicants' resilient gel portion 24 is typically comprised, post-curing, of a semi-solid, gel polyurethane, in one embodiment, typically between 10 and 50 ($10^{-1}$ mm) half-cone penetration. Surface tackiness allows some adhesion to the stuffing tube gland nut and cable conductive surface and jacket. The resilient gel body 24 typically does not absorb more than about 1% of water by weight. Other resilient pliable gel bodies may be used, such as silicon or polyolefinic block co-polymers and other materials with similar core penetration and tackiness. Applicant's curable polyurethane mix is available from KBS Chemical of Fort Worth, Tex., as Part Nos. P-1011 (Polyol) and U-1010 (urethane). Other suitable environmental sealants may also be used.

An applicator 26 may be used in the method of formation of Applicants' gasket 20 as seen below. The applicator stores the liquid mix, typically as a resin (here, urethane) and a hardener (here, Polyol) in the body thereof. The nozzle allows the two compositions to mix as they are being applied (pre-cured). This step is illustrated, for example, in FIG. 6, where a mold 32 is provided having a cutout 32a therein. In cutout 32a, wire mesh knitted rope is inserted. Prior to insertion, a puddle 34 of procured gel may be provided at the bottom of mold 32. The liquid gel is applied and gravity allows it to fill at least up to about the neck portion of cutout 32a. A release film 27, which may be laid into the mold prior to laying in the wire rope or the puddle of gel, is used to lift the cured rope out through the neck. In another configuration (FIG. 7A), the mold is basically U-shaped (without constricted neck section).

Figure 6:
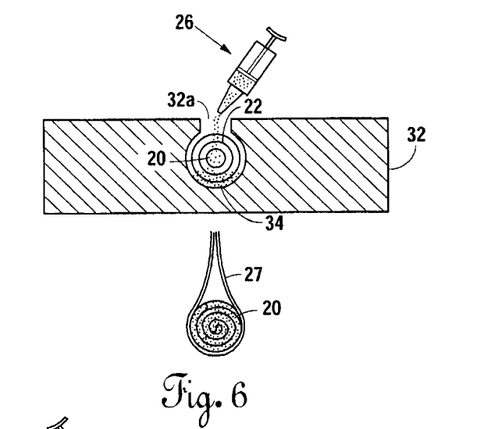
FIG. 6 illustrates one method for manufacturing an elongated, flexible, composite gasket member for use with Applicant's stuffing tube assembly.
Figures 7A, 7B, 7C:
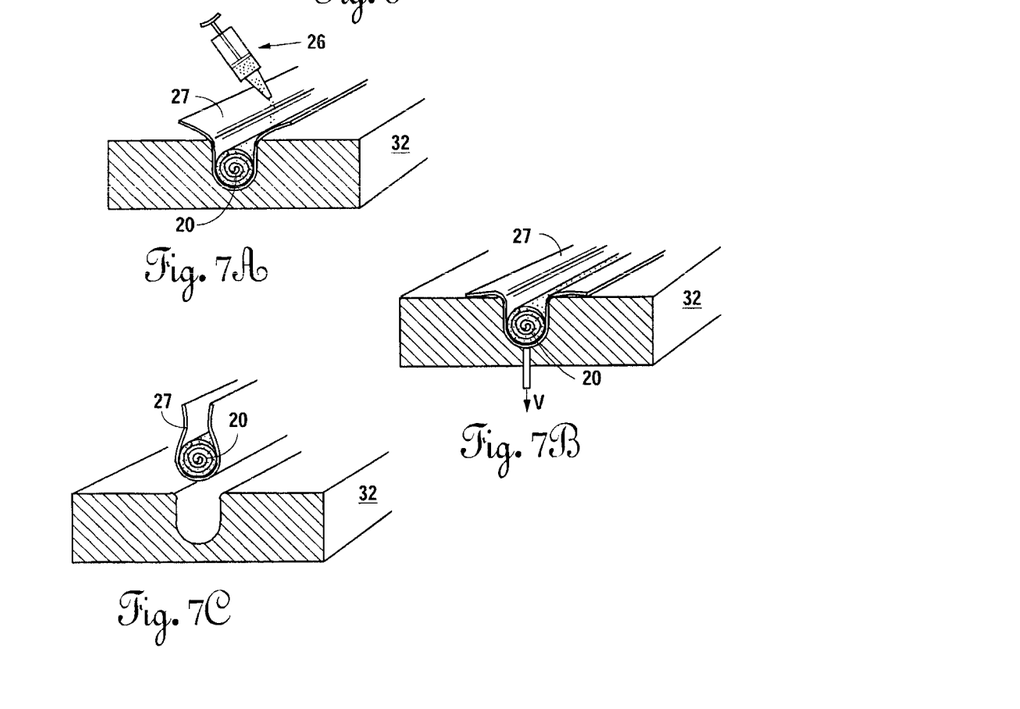
FIGS. 7A, 7B, and 7C illustrate perspective views of a method of making Applicant's elongated, flexible, composite gasket member.

FIGS. 7A, 7B, and 7C illustrate another method, similar to FIG. 6, except with a vacuum V drawn off the base of the mold. Release sheet 27 may be placed across the top after the liquid gel (uncured) has settled to about the top of the U-shape mold. Laying the release cloth across the top will cause it to suck down into and around the metallic rope 22 impregnated with gel 24 as a vacuum is applied before curing. FIG. 7B illustrates the release sheet laying on the mold. FIG. 7C illustrates the cured gasket member 20 being lifted out of the mold after the gel 24 has cured.

Although the invention has been described with reference to a specific embodiment, this description is not meant to be construed in a limiting sense. On the contrary, various modifications of the disclosed embodiments will become apparent to those skilled in the art upon reference to the description of the invention. It is therefore contemplated that the appended claims will cover such modifications, alternatives, and equivalents that fall within the true spirit and scope of the invention.

Although the invention has been described with reference to specific embodiments, this description is not meant to be construed in a limited sense. Various modifications of the disclosed embodiments, as well as alternative embodiments of the inventions will become apparent to persons skilled in the art upon the reference to the description of the invention. It is, therefore, contemplated that the appended claims will cover such modifications that fall within the scope of the invention.

We claim:

1. A stuffing tube assembly for use with a deck or bulkhead (collectively "metallic shell") of a ship, the stuffing tube assembly comprising:
    a cable having insulation on part of a surface thereof, a metallic shielding jacket, and conductors therein, the cable having an exposed section of the metallic shielding jacket and a non-exposed section;
    a metallic stuffing tube conductively engaged with deck or bulkhead, the metallic stuffing tube with cylindrical inner walls including an inner cable channel and an at least partly threaded gland nut receiver space, and a constriction;
    a gland nut having a lower surface, the gland nut encircle part of the cable and at least partly threadably engage the gland nut receiver space above the constriction; and
    an elongated, flexible composite gasket member comprising a flexible conductive member at least partly impregnated with a soft, tacky, flowable gel;

wherein the cable passes through the gland nut and stuffing tube to define an annulus between the cylindrical inner walls of the stuffing tube and the cable, the elongated flexible composite gasket member surrounding the exposed section of the cable and located adjacent the cylindrical inner walls of the metallic stuffing tube above the constriction and below the lower surface of the gland nut, the gland nut threaded into the metallic stuffing tube gland nut receiver space so as to cause the gel of the composite gasket member to flow and the conductive member of the composite gasket member to ground the metallic shielding jacket to the cylindrical inner walls of the metallic stuffing tube.

2. The stuffing tube assembly of claim 1 wherein said flexible conductive member of said composite gasket member is a knitted wire mesh rope.

3. The stuffing tube assembly of claim 2 wherein said gel is made from pre-cured polyurethane.

4. The stuffing tube assembly of claim 2, wherein said knitted wire mesh rope is comprised of multiple plies.

5. The stuffing tube assembly of claim 2, wherein said knitted wire mesh rope is cylindrical in an uncompressed state.

6. The stuffing tube assembly of claim 1 wherein said gel is made from pre-cured polyurethane.

7. The stuffing tube assembly of claim 1, the cable further including a position warning tape.

8. The stuffing tube assembly of claim 1, wherein the flexible conductive member of the composite gasket member is comprised of an ordered arrangement of multiple metal strands.

9. The stuffing tube assembly of claim 1, wherein the cable is an antenna cable.

10. The stuffing tube assembly of claim 1, further including a washer.

11. The stuffing tube assembly of claim 1, further including additional soft, tacky gel material not comprising the composite gasket member.

12. The stuffing tube assembly of claim 1, wherein the composite gasket member wraps around the cable multiple times to surround the cable.

13. The stuffing tube assembly of claim 1, wherein the composite gasket member comprises a plurality of layers of conductive member.

14. The stuffing tube assembly of claim 13, wherein the composite gasket member comprises a plurality of layers of gel.

15. The stuffing tube assembly of claim 1, wherein the flexible conductive member comprises a plethora of randomly-oriented wire strands.

16. A gasket member for use in a stuffing tube assembly of a ship said stuffing tube assembly having a cable passing through it, the gasket member comprising:
 a wire mesh rope at least partly impregnated with a soft, tacky, flexible, flowable gel;
 wherein said wire mesh rope is elongated and flexible; and
 wherein said wire mesh rope is conductive to electricity.

17. The gasket member of claim 16, wherein said wire mesh rope is knitted.

18. The gasket member of claim 17, wherein said knitted wire mesh rope is cylindrical in an uncompressed state.

19. The gasket member of claim 16 wherein said soft, tacky gel is cured polyurethane.

20. The gasket member of claim 16 wherein said cable provides a shield against EMI or an electromagnetic pulse or other electronic interference.

21. The gasket member of claim 16, wherein said knitted wire mesh rope is comprised of multiple plies.

22. The gasket member of claim 16, wherein the hardness of the gel is between 10 and 50 ($10^{-1}$ mm) half-cone penetration.

23. The gasket member of claim 16, wherein the gasket member is adapted to wrap around a cable multiple times to surround the cable.

24. The gasket member of claim 16, wherein the gasket member comprises a plurality of layers of mesh rope.

25. The gasket member of claim 24, wherein the composite gasket member comprises a plurality of layers of gel.

26. The gasket member of claim 16, wherein the mesh rope comprises a plethora of randomly-oriented wire strands.

27. A stuffing tube assembly for use with a deck or bulkhead (collectively "metallic shell") of a ship, the stuffing tube assembly comprising:
 a cable having insulation on at least part of a surface thereof, a metallic shielding jacket, and conductors therein, the cable having an exposed section of the metallic shielding jacket and a non-exposed section;
 a metallic stuffing tube conductively engaged with deck or a bulkhead, the metallic stuffing tube with cylindrical inner walls defining an inner cable channel and an at least partly threaded gland nut receiver space, and a constriction;
 a gland nut to at least partly threadably engage the gland nut receiver space above the constriction; and
 an elongated, flexible composite gasket member comprising a flexible conductive member at least partly impregnated with a soft, tacky, flexible, flowable gel;
 wherein the cable passes through the gland nut and stuffing tube to define an annulus between the cylindrical inner walls of the stuffing tube, the elongated flexible composite gasket member surrounding the exposed section of the cable and located adjacent the cylindrical inner walls of the metallic stuffing tube above the constriction and below the lower surface of the gland nut, the gland nut threaded into the metallic stuffing tube gland nut receiver space so as to cause the gel of the composite gasket member to flow and to assist in making contact between the metallic shielding jacket, the flexible conductive member and the inner walls of the stuffing tube so as to ground the metallic shielding jacket; and
 wherein the gasket member is wrapped in multiple courses about said exposed section of said cable metallic shielding jacket.

28. The stuffing tube assembly of claim 27, wherein said flexible conductive member of said composite gasket member is a knitted wire mesh.

29. The stuffing tube assembly of claim 27, wherein said gel is made from pre-cured polyurethane.

30. The stuffing tube assembly of claim 27, further including a position warning tape.

31. The stuffing tube assembly of claim 27, wherein the gasket member comprises a plurality of layers of conductive member.

32. The stuffing tube assembly of claim 31, wherein the composite gasket member comprises a plurality of layers of gel.

33. The stuffing tube assembly of claim 27, wherein the conductive member comprises a plethora of randomly-oriented wire strands.

34. A stuffing tube assembly for use with a deck or bulkhead (collectively "metallic shell") of a ship, the stuffing tube comprising:
- a cable having insulation on part of a surface thereof, a metallic shielding jacket, and conductors therein, the cable having an exposed section of the metallic shielding jacket and a non-exposed section;
- a metallic stuffing tube with an inner cable channel and an at least partly threaded gland nut receiver space, and a constriction between the gland nut receiver space and the inner channel;
- a gland nut adapted to threadably engage the gland nut receiver space;
- an elongated, flexible composite gasket member comprising a flexible conductive member at least partly impregnated with a soft, tacky, flexible, flowable gel;
- wherein the cable passes through the gland nut and stuffing tube, the elongated flexible composite gasket member surrounding the exposed section of the cable and located adjacent inner walls of the metallic stuffing tube above the constriction, the gland nut threaded into the metallic stuffing tube gland nut receiver space so as to urge against the composite gasket member;
- wherein the gasket member is wrapped about said exposed section of said cable metallic shielding jacket;
- wherein said conductive member of said composite gasket member is a knitted wire mesh rope;
- wherein said gel is made from pre-cured polyurethane; and
- further including a position warning tape.

* * * * *